United States Patent
Theiler et al.

(10) Patent No.: US 9,779,714 B2
(45) Date of Patent: Oct. 3, 2017

(54) ACTIVE NOISE CONTROL ARRANGEMENT, ACTIVE NOISE CONTROL HEADPHONE AND CALIBRATION METHOD

(75) Inventors: Helmut Theiler, Lieboch (AT); Roberto Simmarano, Graz (AT)

(73) Assignee: AMS AG, Unterpremstaetten (AT)

(*) Notice: Subject to any disclaimer, the term of this patent is extended or adjusted under 35 U.S.C. 154(b) by 1070 days.

(21) Appl. No.: 13/127,234

(22) PCT Filed: Oct. 6, 2009
(Under 37 CFR 1.47)

(86) PCT No.: PCT/EP2009/062980
§ 371 (c)(1),
(2), (4) Date: Sep. 30, 2011

(87) PCT Pub. No.: WO2010/049241
PCT Pub. Date: May 6, 2010

(65) Prior Publication Data
US 2013/0208908 A1    Aug. 15, 2013

(30) Foreign Application Priority Data

Oct. 31, 2008 (EP) .................... 08019128

(51) Int. Cl.
*G10K 11/16* (2006.01)
*G10K 11/178* (2006.01)
(Continued)

(52) U.S. Cl.
CPC ............ *G10K 11/16* (2013.01); *G10K 11/178* (2013.01); *G10K 2210/1081* (2013.01);
(Continued)

(58) Field of Classification Search
USPC ... 381/71.1, 71.6, 71.11, 372, 94.1, 104, 60, 381/72, 83, 93, 92, 317, 318, 321, 107;
(Continued)

(56) References Cited

U.S. PATENT DOCUMENTS 5,029,215 A * 7/1991 Miller, II ................. H04R 1/38
                                                              367/13
5,627,747 A    5/1997 Melton et al.
(Continued)

FOREIGN PATENT DOCUMENTS

DE    19926552         12/2000
EP     1174003 B1  *    7/2004
(Continued)

OTHER PUBLICATIONS

National Semiconductor, LMV1089,2008.*
(Continued)

*Primary Examiner* — Davetta W Goins
*Assistant Examiner* — Kuassi Ganmavo
(74) *Attorney, Agent, or Firm* — McDermott Will & Emery LLP

(57) ABSTRACT

An active noise control arrangement has a signal input (SI), a microphone input (MI), a signal output (SO) and a digital interface (DI). A signal processing block (SP) coupled to the microphone input (MI) by means of an amplifier (MA) has a digitally adjustable gain and comprises combining means (CM) and a filter (TP). The signal processing block (SP) is configured to generate an output signal at the signal output (SO) as a function of an input signal at the signal input (SI) and an amplified microphone signal. A control block (CB) is coupled to the digital interface (DI) and configured to adjust the gain of the amplifier (MA).

22 Claims, 5 Drawing Sheets

(51) Int. Cl.
*G11C 13/00* (2006.01)
*G11C 11/56* (2006.01)

(52) U.S. Cl.
CPC ...... *G10K 2210/3056* (2013.01); *G11C 11/56* (2013.01); *G11C 13/0002* (2013.01); *G11C 13/0007* (2013.01)

(58) Field of Classification Search
USPC ............................................. 700/94; 704/226
See application file for complete search history.

(56) References Cited

U.S. PATENT DOCUMENTS

| | | | |
|---|---|---|---|
| 5,734,713 A * | 3/1998 | Mauney et al. | ............... 379/395 |
| 5,815,582 A | 9/1998 | Claybaugh et al. | |
| 5,937,070 A * | 8/1999 | Todter | ................ G10K 11/1782 |
| | | | 381/71.12 |
| 6,118,878 A | 9/2000 | Jones | |
| 6,198,828 B1 | 3/2001 | Kuo | |
| 6,239,655 B1 * | 5/2001 | Orozov et al. | ................... 330/86 |
| 6,278,786 B1 * | 8/2001 | McIntosh | ..................... 381/71.6 |
| 6,532,296 B1 * | 3/2003 | Vaudrey | ............. G10K 11/1788 |
| | | | 381/371 |
| 7,065,219 B1 * | 6/2006 | Abe et al. | ........................ 381/74 |
| 7,177,433 B2 * | 2/2007 | Sibbald | ........................ 381/71.6 |
| 7,283,635 B1 * | 10/2007 | Anderson et al. | .............. 381/74 |
| 7,515,721 B2 * | 4/2009 | Tashev | ................... H04R 3/005 |
| | | | 381/92 |
| 7,574,006 B2 * | 8/2009 | Funayama et al. | ......... 381/71.12 |
| 7,817,584 B2 * | 10/2010 | Campbell et al. | ............. 370/261 |
| 8,170,237 B2 * | 5/2012 | Shajaan et al. | ............... 381/113 |
| 8,406,441 B2 * | 3/2013 | Ruwisch | ....................... 381/317 |
| 8,781,147 B1 * | 7/2014 | Giuroiu | ......................... 381/384 |
| 2001/0053228 A1 | 12/2001 | Jones | |
| 2003/0198354 A1 * | 10/2003 | Stuart | .................... G01H 3/005 |
| | | | 381/71.9 |
| 2005/0117754 A1 * | 6/2005 | Sakawaki | .................... 381/71.6 |
| 2005/0135170 A1 * | 6/2005 | Mozdzen | ...................... 365/211 |
| 2005/0175190 A1 * | 8/2005 | Tashev | .................. H04R 3/005 |
| | | | 381/92 |
| 2008/0075306 A1 * | 3/2008 | Poulsen | ............... H04R 19/005 |
| | | | 381/111 |
| 2009/0010447 A1 | 1/2009 | Waite et al. | |
| 2010/0142718 A1 * | 6/2010 | Chin | .................... G10K 11/178 |
| | | | 381/71.6 |
| 2010/0226505 A1 * | 9/2010 | Kimura | .............. G10K 11/1788 |
| | | | 381/71.6 |
| 2010/0310093 A1 * | 12/2010 | Semcken | ...................... 381/104 |
| 2013/0022213 A1 * | 1/2013 | Alcock | ......................... 381/71.6 |
| 2015/0092951 A1 * | 4/2015 | Ou | .......................... H03G 3/20 |
| | | | 381/71.6 |

FOREIGN PATENT DOCUMENTS

| | | |
|---|---|---|
| GB | 2 401 744 | 11/2004 |
| GB | 2 445 984 | 7/2008 |
| WO | WO 95/08906 | 3/1995 |
| WO | WO 99/48324 | 9/1999 |
| WO | WO 2004/002383 | 1/2004 |
| WO | WO 2009/041012 | 4/2009 |
| WO | WO 2009081189 A1 * | 7/2009 |

OTHER PUBLICATIONS

Antila, Marko: "Contemporary Electronics Solutions for Active Noise Control", VTT Industrial Systems, Sep. 20-22, 2004, pp. 1-8.
Aplin, John: "Active Noise Control—From Research to Reality", Flight Controls Group, 1994, pp. 111-449.
Maxim: "32-Tap, Nonvolatile, Linear-Taper Digital Potentiometers in SOT23", Circuit Diagram, Oct. 2003, pp. 12.
Maxim: "One-Time Programmable, Linear-Taper Digital Potentiometers", Mar. 2005, pp. 1-10.
Sennheiser Electronic GmbH & Co. Kg: "HMEC 46" Instructions for Use, Feb. 2007 (74 pages).
Sennheiser Electronic GmbH & Co. Kg: "SMD Component Diagramm for HMEC Headset", (1 page).

* cited by examiner

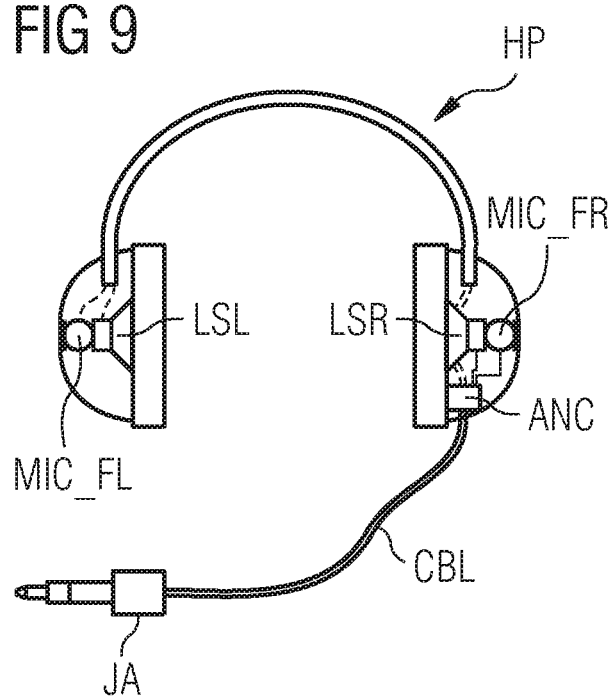
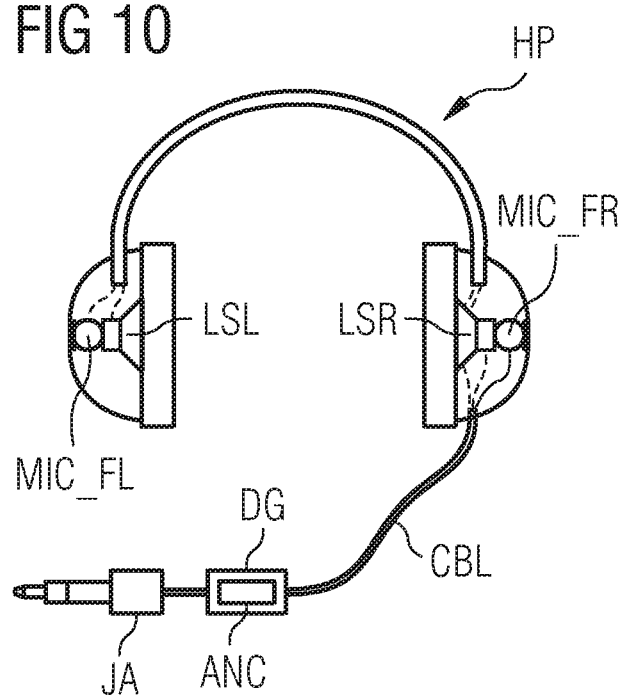

ACTIVE NOISE CONTROL ARRANGEMENT, ACTIVE NOISE CONTROL HEADPHONE AND CALIBRATION METHOD

RELATED APPLICATIONS

This application is a U.S. National Phase Application under 35 USC 371 of International Application No. PCT/EP2009/062980, filed on 6 Oct. 2009.

This patent application claims the priority of European Patent Application No. 08019128.1, filed 31 Oct. 2008, the disclosure content of which is hereby incorporated by reference.

FIELD OF THE INVENTION

The invention relates to an active noise control arrangement, an active noise control headphone with such an active noise control arrangement, and to a calibration method for an active noise control headphone.

BACKGROUND OF THE INVENTION

In recent sound applications, often headphones are used which perform an active noise control or active noise cancellation. To this end, a microphone is situated at or inside the headphone providing a microphone signal comprising, for example, environmental noise. The active noise control evaluates the microphone signal and generates a correction signal provided to the loudspeakers of the headphone for minimizing the effect of the environmental noise or other disturbing sounds. For example, the external environmental noise and the correction signal cancel each other out, in an ideal case. However, microphones which are used in active noise control headphones usually have different gain characteristics due to manufacturing tolerances. Furthermore, the industrial design of the headphones and the mechanical implementations usually have different passive attenuation characteristics. Therefore, a gain of the noise control electronics needs to be adjusted during manufacturing of the headphone. In other words, active noise control headphones require calibration of gains at the production line. In particular, gain adjustment of the sensing microphones' amplification stages is required in order to achieve a wanted noise reduction performance. Such a calibration process is usually performed by adjusting of trimmer potentiometers that are manually set in the production line on a per headphone unit basis. To this end, the headphone is usually placed on an artificial head which includes microphones inside artificial ears for measurement purposes. An external test audio signal is generated to simulate environmental noise. An amount of residual test audio signal that arrives at the artificial ear after attenuation by means of the active noise control is measured. Individual microphone gains and other parameters of the active noise control circuit are adjusted manually in order to minimize the amount of test audio signal that is picked up by the measurement microphones. However, this calibration method results in increased manufacturing time and therefore increased costs.

Furthermore, if the active noise control circuit is located in the headphone itself, then the respective ear cup needs to provide an opening in order to enable access to the trimmer potentiometers. These openings may alter the acoustic behavior of the headset resulting in a less accurate calibration.

GB 2445984 A shows ambient noise reduction for ear-worn devices and the like. The suggested feed-forward noise-reduction system provides predetermined filter parameters, such as the gain and cut-off frequency of a selected filter stage used in the noise-reduction processing. These parameters are mathematically modelled and the model is adjusted in real-time, in response to user-interpretation of a graphical display of a predicted residual noise amplitude spectrum. This allows the user or computer control to inspect the predicted residual noise level amplitude spectrum and to iteratively adjust the filter parameters to minimise residual noise in a chosen environment.

U.S. Pat. No. 6,118,878 A shows an active noise cancellation system including several features such as locating a residual microphone radially offset from the center of a sound generator to detect a signal more similar to that incident upon the eardrum of the user and a mechanism for detecting changes in the acoustic characteristics of the environment The system automatically responds to changes, for example, by reducing the gain or the frequency response of the system to preserve stability. The system includes further features for detecting imminent instability and compensating for it.

SUMMARY OF THE INVENTION

It is an object of the invention to provide an active noise control arrangement and an active noise control headphone which can be calibrated more efficiently. It is a further object of the invention to provide a calibration method for an active noise control headphone which enables a calibration with an improved accuracy and reduced time.

In one embodiment, an active noise control arrangement comprises a signal input for receiving an input signal, a microphone input for receiving a microphone signal, a signal output for providing an output signal and a digital interface. A signal processing block is coupled to the microphone input by means of an amplifier having a digitally adjustable gain. The signal processing block comprises combining means and a filter and is configured to generate the output signal at the signal output as a function of the input signal and the amplified microphone signal. A control block is coupled to the digital interface and configured to adjust the gain of the amplifier.

During operation, the active noise control arrangement amplifies the microphone signal by means of the amplifier having the digitally adjustable gain. However, the amplifier preferably is an analog amplifier. In the signal processing block the amplified microphone signal and the input signal are further processed by filtering and combining to the output signal. The order of filtering and combining can vary for different embodiments. Preferably, the filter is designed to filter out higher frequency components. For example, the filter is a low-pass filter or a band-pass filter.

As the gain of the amplifier is adjustable electronically, in particular digitally, no trimmer potentiometers are needed for the active noise control arrangement, which have to be adjusted manually. A gain level for the amplifier can be provided to the control block via the digital interface. For example, the gain level is provided by a calibration circuit evaluating residual noise. Therefore, the active noise control arrangement can be calibrated in less time and with a higher accuracy.

Preferably, the digital interface is a serial interface. In other words, a serial communication can be performed with the control block.

In various embodiments, the signal processing block can work according to a feed-forward principle or according to a feed-back principle which mainly differ with respect to a source of the microphone signal. Furthermore other implementations of the signal processing block can be used which use different signal processing algorithms. Such implementations are known in the art.

It should be noted that although the embodiments are described for a single channel operation, dual channel, stereo channel or multi channel operation is also possible with the active noise control arrangement.

In one embodiment, the amplifier comprises a digitally controllable resistor for adjusting the gain. For example, the controllable resistor comprises a switchable resistor network. Accordingly, a resistance of the controllable resistor is adjusted in response to a digital signal which is provided by the control block.

While a trimmer potentiometer of a conventional active noise control arrangement can alter its resistance due to mechanical effects like, for example, a mechanical hit against the active noise control arrangement, resulting in an altered gain and decreased performance, the digitally controllable resistance is independent of such influences. A wanted resistance and therefore also a desired gain of the amplifier can be maintained by providing the same digital signal to the controllable resistor.

In one embodiment, the control block of the active noise control arrangement comprises a memory unit which is configured to store a digital adjustment value. Herein, in a calibration mode of operation, the control block is configured to write the digital adjustment value to the memory unit and, in a normal mode of operation, the control block is configured to read the digital adjustment value from the memory unit. In other words, an ideal digital adjustment value which can be determined during a calibration process in the calibration mode of operation can be written to the memory for further usage. During normal mode of operation, said adjustment value is used for adjusting or setting the gain of the amplifier.

The memory unit can comprise memory elements like a PROM, an EEPROM or a flash memory. Preferably, the memory unit comprises a plurality of programmable fuses for storing the digital adjustment value. For example, the memory unit comprises one fuse, respectively, for each bit of a digital word corresponding to the adjustment value. During calibration, a respective status of the fuses, conducting or non-conducting, is programmed depending on the adjustment value determined. During normal operation, a respective status of the fuses is read out and used for setting the gain of the amplifier.

In one embodiment, the control block is configured to detect an initialization signal at the digital interface and to switch to the calibration mode of operation depending on a detection of the initialization signal. In other words, the active noise control arrangement usually operates in the normal mode of operation and only switches to the calibration mode of operation if the special initialization signal is received and detected.

For example, in various embodiments, the digital interface and the signal input of the active noise control arrangement are connected to a common connection like an audio jack connector. In this case, as well an electrical audio signal as digital signals for the control block can be received commonly at the signal input and the digital interface. By making a switch to the calibration mode of operation dependent on the detection of a predetermined initialization signal, an unwanted calibration operation can be avoided.

In a further embodiment, a calibration status is written to the memory unit after a calibration has been performed and the respective adjustment value has been determined and/or written to the memory unit. If the memory unit is one-time-programmable only, switching to the calibration mode of operation can be made dependent on the calibration status. However, the dependency on the calibration status can be employed also for a multiple programmable memory unit. As a consequence, if a calibration status corresponding to a calibrated adjustment value is set, switching to the calibration mode of operation can be avoided.

In various embodiments, the filter of the signal processing block has a transfer function which is digitally adjustable by the control block. In other words, not only the gain of the amplifier can be adjusted by the control block but also the low-pass filter. For example, a corner frequency of a low-pass filter can be set to an optimized value. In many cases, low-pass filters are realized with RC elements. In this case, either the respective resistance or the respective capacitance of such a filter can be digitally set to achieve a wanted transfer function. Accordingly, the accuracy of the active noise control arrangement can be improved.

In one embodiment, an active noise control headphone comprises an active noise control arrangement according to one of the embodiments described above. Furthermore, the headphone comprises at least one loudspeaker connected to the signal output and at least one microphone connected to the microphone input. An audio connector is connected to the signal input and to the digital interface.

The term headphone herein comprises various forms of earpieces, earphones, earbuds, stereophones, headsets, hands free kits for mobile phones or other sound reproducing devices.

According to the embodiments described above, the active noise control arrangement of the headphone can be calibrated or adjusted via the audio connector and the digital interface. No manual adjustment like setting a trimmer potentiometer is necessary.

In various embodiments, the active noise control arrangement is comprised by an integrated circuit. The integrated circuit or the active noise control arrangement, respectively, can be arranged at the at least one loudspeaker or in a housing being arranged at cable coupling audio connector to the at least one loudspeaker. For example, the active noise control arrangement can be placed inside an ear cup of the headphone. As an alternative, the arrangement can be provided within a housing or dongle through which the headphone cable goes.

A calibration method is performed for an active noise control headphone which comprises an active noise control arrangement according to one of the embodiments described above, at least one loudspeaker connected to the signal output and at least one microphone connected to the microphone input. An embodiment of the calibration method comprises placing the headphone on an artificial head having at least one further microphone inside. An external sound signal is provided to the headphone. Active noise control is performed with the active noise control arrangement. A residual audio level is measured with the at least one further microphone. The gain of the amplifier is adjusted via the digital interface and the control block such that the residual audio level is minimized.

Accordingly, during the calibration process, it is tested how good a noise control performance of the noise control arrangement is, in response to the external sound signal which is provided to the headphone as an acoustic wave. The performance is tested by evaluating the residual sound level measured inside the artificial head with the at least one further microphone. The gain of the amplifier is adjusted until an optimal performance corresponding to a minimum of the residual sound level is achieved. The calibration can be performed without the need for human interaction. Accordingly, a better accuracy of the arrangement can be achieved. Furthermore, the calibration process can be performed in less time.

In one embodiment of the calibration method, the headphone comprises an active noise control arrangement with at least a memory unit as described above. In this case, the control block is controlled via the digital interface to write a digital adjustment value corresponding to the minimized residual audio level to the memory unit.

In a further embodiment of the calibration method, the active noise control arrangement comprises a control block being configured to detect an initialization signal, as described above. In this case, the method further comprises providing the initialization signal to the control block via the digital interface.

In a further embodiment of the calibration method, the active noise control arrangement comprises a filter having a transfer function being digitally adjustable as described above. In this case, the calibration method further comprises adjusting the transfer function of the filter via the digital interface and the control block such that the residual audio level is minimized.

BRIEF DESCRIPTION OF THE DRAWINGS

The text below explains the invention in detail using exemplary embodiments with reference to the drawings, in which:

FIG. 9 is a third embodiment of an active noise control headphone, and FIG. 10 is a fourth embodiment of an active noise control headphone.

DETAILED DESCRIPTION OF THE DRAWINGS

Figure 1:
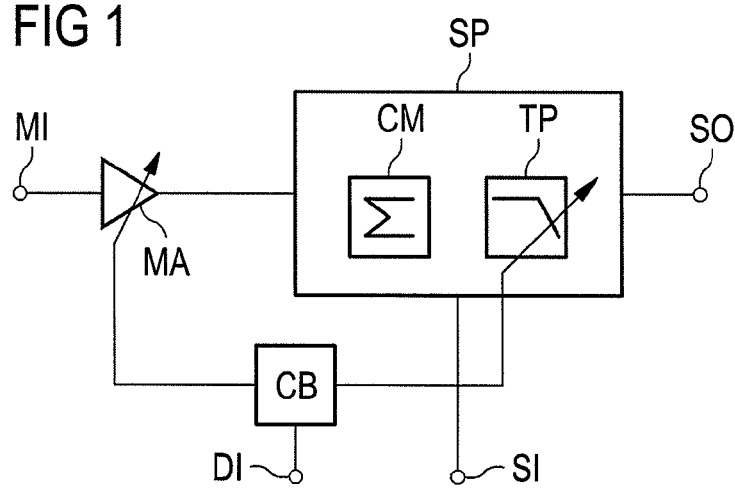
FIG. 1 is a first embodiment of an active noise control arrangement.

In the drawings, like reference numerals designate corresponding similar parts or elements.

FIG. 1 shows an exemplary embodiment of an active noise control arrangement which comprises a microphone input MI, a digital interface DI, a signal input SI, and a signal output SO. A signal processing block SP is coupled to the microphone input MI by means of an amplifier MA which has an adjustable gain. The signal processing block SP comprises combining means CM and a filter TP which has an adjustable transfer function which in this case has a low-pass characteristic.

The active noise control further comprises a control block CB which is coupled to the digital interface DI and which is further coupled to the amplifier MA and the low-pass filter TP for adjusting the gain and the transfer function, respectively. An output of the signal processing block SP is coupled to the signal output SO.

During operation of the active noise control arrangement, an input signal is provided to the arrangement via the signal input SI. This input signal is meant to be provided to a loudspeaker connected to the signal output SO. Furthermore, a microphone is connected to the microphone input MI for providing a microphone signal. For example, the loudspeaker and the microphone are part of a headphone, wherein the microphone is used to sense environmental sound or noise.

The term headphone herein comprises various forms of earpieces, earphones, earbuds, stereophones, headsets, hands free kits for mobile phones or other sound reproducing devices.

The microphone signal is amplified by the amplifier MA, wherein a gain of the amplifier MA and therefore a relative level of the microphone signal is set or adjusted by the control block CB. Preferably, the gain of the amplifier MA is set in a digital manner. The amplifier MA may be an analog amplifier. The amplified microphone signal is provided to the signal processing block SP where it is filtered and combined with the input signal for generating the effective output signal provided to the signal output SO and the loudspeaker, respectively. A sequence of filtering and combination within the signal processing block SP can be different in various embodiments. To adjust the transfer function of the low-pass filter TP, the control block CB can, for example, digitally set or adjust a corner frequency of the low-pass filter transfer function.

Respective values for setting the gain of the amplifier MA and the transfer function of the low-pass filter TP can be provided via the digital interface DI. Preferably, the digital interface DI is a serial interface. However, in various embodiments, it is not necessary to always provide the respective values to the control block CB via the digital interface DI during operation. In this case, the respective values can be provided to the control block CB via the digital interface DI for storing in a calibration mode of operation, while during normal operation, the respective values are taken from a respective memory.

The active noise control arrangement can operate according to a feed-forward principle or according to a feed-back principle. When employing a feed-forward principle, the microphone connected to the microphone input MI mainly records environmental noise, independent from sound waves produced by the loudspeaker connected to the signal output SO. When the active noise control arrangement is operated according to the feed-back principle, the microphone is situated near the loudspeaker and usually records both environmental noise and sound waves produced by the loudspeaker. A specific structure of the arrangement and especially of the signal processing block SP usually is different for the described principles. However, in both cases, the performance of the active noise control arrangement depends on an appropriately set level of the microphone signal. Further details for the feed-forward principle and the feed-back principle will be described in conjunction with FIGS. 2 and 3, respectively. However, other implementations of the signal processing block can also be used which use different signal processing algorithms.

Although the active noise control arrangement shown in FIG. 1 is described only for a single channel signal processing, the arrangement can easily be provided as a multi-channel solution. As for example in headphones, usually stereo signals are used, it is convenient to provide the arrangement with two signal processing channels for processing two microphone signals, two input signals and two output signals.

Figure 2:
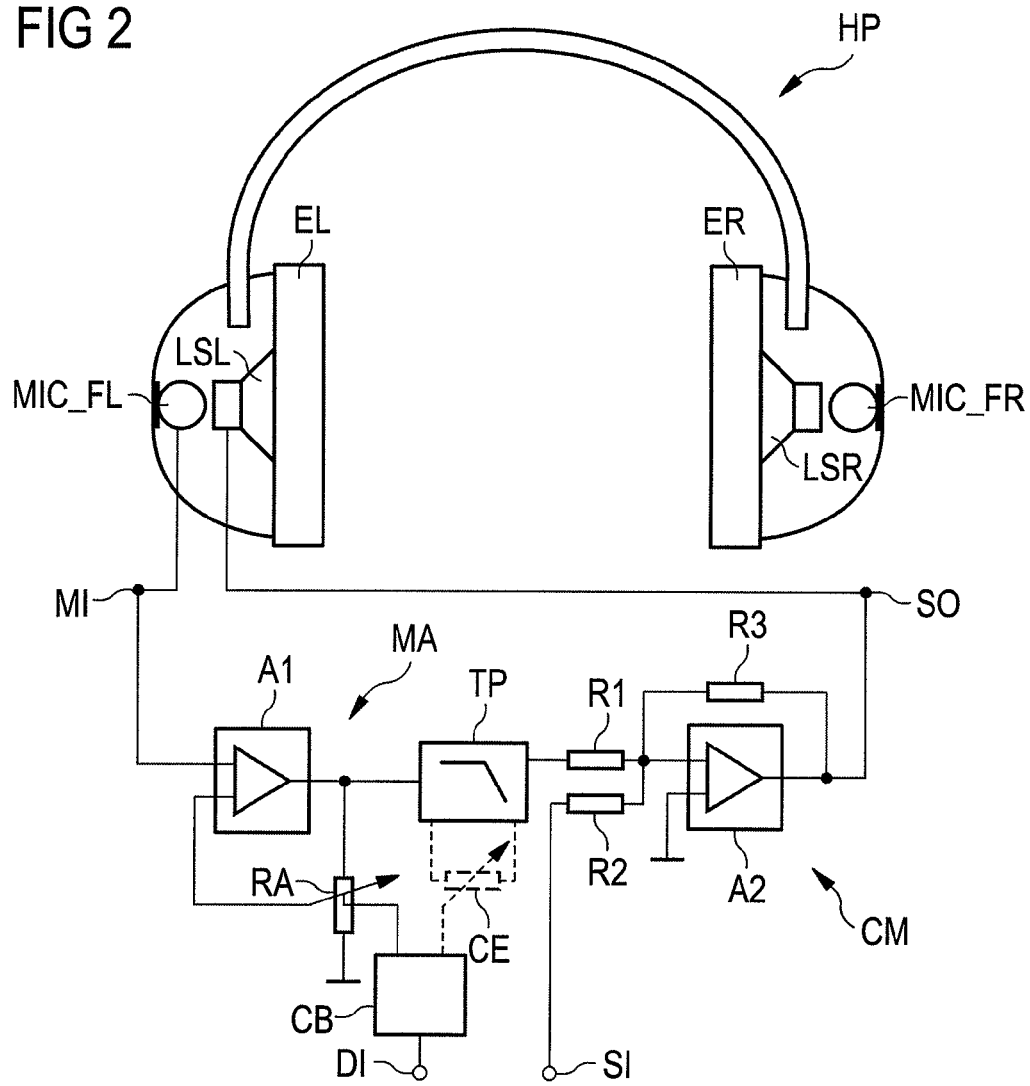
FIG. 2 is a first embodiment of an active noise control headphone.

FIG. 2 shows an exemplary embodiment of an active noise control headphone with an active noise control arrangement working according to a feed-forward principle. A headphone HP comprises two loudspeakers LSL, LSR and two microphones MIC_FL, MIC_FR which are situated in a left and a right ear cup EL, ER, respectively. The microphones MIC_FL, MIC_FR are arranged such that they mainly record sounds or noise from outside the ear cups EL, ER.

The active noise control arrangement comprises the amplifier MA with an amplifier A1 connected to the microphone input MI and with a controllable feedback resistor RA coupling an output of the amplifier A1 to a further input. The low-pass filter TP is coupled to the output of the amplifier MA. The combining means CM comprise a further amplifier A2 having a first and a second resistor R1, R2 connected to its input, wherein the first resistor R1 couples the low-pass filter TP to the amplifier A2 and the second resistor R2 couples the signal input SI to said input of the amplifier A2. A third resistor R3 acts as a feedback resistor for the amplifier A2 and connects said input to its output. The output of the amplifier A2 is further coupled to the signal output SO.

The filter TP comprises a controllable element CE which is controlled by the control block CB. Furthermore, the controllable resistor RA is controlled by the control block CB. The microphone MIC_FL is coupled to the microphone input MI and the loudspeaker LSL is coupled to the signal output SO. Respective signal paths for the right loudspeaker LSR and the respective microphone MIC_FR are omitted in the drawing for reasons of a better overview only.

During operation of the active noise control headphone, the microphone signal from the microphone MIC_FL is amplified by the amplifier MA, wherein the respective gain of the amplifier MA is set by the control block CB by adjusting or setting the controllable feedback resistor RA. In other words, the division ratio of the resistor RA is set such that the amplifier MA has the desired gain. The amplified microphone signal is low-pass filtered to remove higher frequency portions of the microphone signal. During amplification and low-pass filtering, the microphone signal is phase inverted. The phrase "the microphone signal is phase inverted" refers to a concept well known in the field of active noise cancellation. Generally, the signal path comprising amplifier and low-pass filter accomplishes the phase to be inverted. The inversion may be controlled by the filter itself by choosing appropriate filter characteristics or even by the amplifier. For example, the amplifier may be implemented to allow for summing or integration of input signal effectively resulting in phase inversion. Accordingly, by combining the processed microphone signal with the input signal with the combining means CM, both the input signal and the processed microphone signal are provided to the loudspeaker LSL. In the headphone HP, the phase-inverted portion of the microphone signal and the environmental noise cancel each other out up to a certain level.

In particular, for an efficient noise canceling, an amplitude of the phase-inverted microphone signal at the loudspeaker LSL should correspond to an amplitude of the environmental noise at or around the loudspeaker LSL. Accordingly, the amplitude of the microphone signal should be adjusted adequately. For example, deviations of a few percent from an ideal gain of the amplifier MA can lead to a remarkable degradation of the performance of active noise control arrangement. However, an ideal adjustment value for the gain or the controllable resistor RA, respectively, can be provided by the control block CB.

Because of a signal delay within the active noise control arrangement, a time difference between the environmental noise and the signal at the loudspeaker LSL can occur. Furthermore, because as well the environmental noise and the output signal comprise a plurality of frequencies, especially for higher frequencies such time difference can result in a phase difference between the signals. As an inverted phase of the processed microphone signal is necessary for the noise cancellation, the phase difference of higher frequency portions of the respective signals can lead to non-matching phases. These critical higher frequencies are filtered out by the low-pass filter TP. However, a transfer function, in particular a corner frequency of the low-pass filter TP, can be adjusted by the control block CB. It is also possible to have a common, preset transfer function for the low-pass filter TP. However, performance may be increased by adjusting the transfer function.

The respective adjustment values for the amplifier MA and/or the low-pass filter TP are provided by the control block CB, which may have the respective adjustment values stored or received via its digital interface DI.

Figure 3:
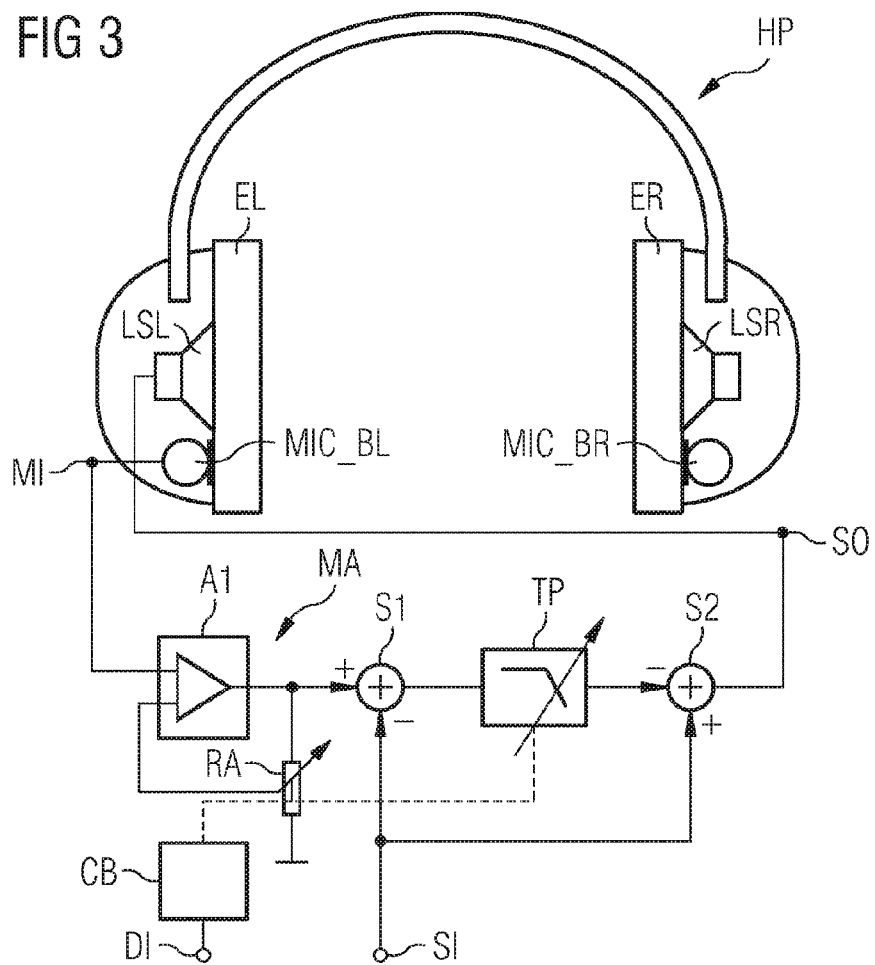
FIG. 3 is a second embodiment of an active noise control headphone.

FIG. 3 shows an alternative embodiment of an active noise control headphone with an active noise control arrangement operating according to a feedback principle. To this end, the headphone HP comprises the loudspeakers LSL, LSR and microphones MIC_BL, MIC_BR which are arranged inside the ear cups EL, ER. The microphones MIC_BL, MIC_BR are arranged within the ear cups EL, ER such that they mainly record sounds and/or noise within the ear cups EL, ER.

The active noise control arrangement comprises, similar to the embodiment of FIG. 2, an amplifier MA with a controllable feedback resistor RA for amplifying a microphone signal at the microphone input MI which is coupled to the microphone MIC_BL. An output of the amplifier MA is coupled to a summing element S1 for building a difference with the input signal at the signal input SI. The resulting output signal of the summing element S1 is provided to the low-pass filter TP whose output is provided to a further summing element S2 together with the input signal. An output of the further summing element S2 is coupled to the signal output SO and further to the loudspeaker LSL.

The microphone MIC_BL usually records both a signal output by the loudspeaker LSL and environmental noise. To this end, an input signal portion is subtracted from the amplified microphone signal at the summing element S1. Similar to the description of FIG. 2, also in this case, the higher frequency portions of the noise signal at the output of the summing element S1 are filtered out by the low-pass filter TP to avoid frequency portions having an unwanted phase difference. The output signal of the low-pass filter TP is combined phase inverted with the input signal by means of the further summing element S2.

Figure 4:
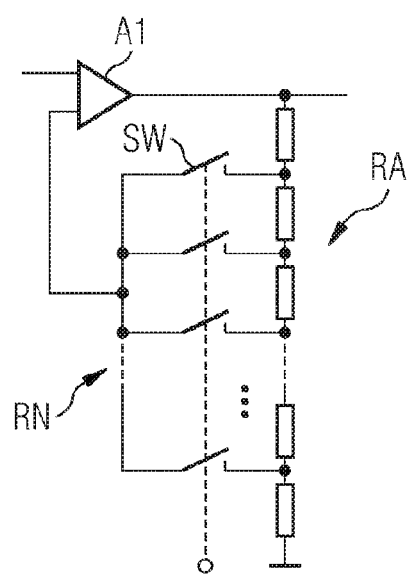
FIG. 4 is an embodiment of a controllable amplifier.

As for the feed-forward principle described for FIG. 4, also for the active noise control headphone according to a feedback principle, an appropriate setting of the controllable resistor RA resulting in an appropriate gain, and respective filtering of the processed signal are necessary for achieving a wanted performance of the arrangement. The respective ideal settings are effected by the control block CB in response to adjustment values stored inside or provided to the control block CB.

FIG. 4 shows an exemplary embodiment of the amplifier A1 with the controllable feedback resistor RA which comprises a switchable resistor network RN. The resistor network RN comprises a plurality of resistors connected in series. A connection point between each two resistors is coupled to a common connection by means of a respective switch SW. The switches SW are controlled by a respective switching signal which can be provided by the control block CB not shown here. The common connection of the resistor network RN is coupled to a feedback input of the amplifier A1.

A switching state of the switches SW determines a respective resistance between the output and the feedback input of the amplifier A1 or, in other words, a divider ratio of the controllable resistor RA. For example, the resistor network RN comprises a number of switches SW corresponding to a power of two such that a respective switching state can be represented as a multi-bit binary value. Accordingly, the gain of the amplifier can be set or adjusted digitally.

Low-pass filters in many cases comprise RC elements determining one or more corner frequencies of the low-pass filter. For adjusting the transfer function and/or the corner frequency, respectively, a resistance of the RC element, a capacitance of the RC element or both can be varied. For a low-pass filter with an adjustable transfer function as shown in FIGS. 1, 2 and 3, a switchable resistor network as shown in FIG. 4 can be used. However, in some applications, it is desirable to adjust a respective capacitance value.

Figure 5:
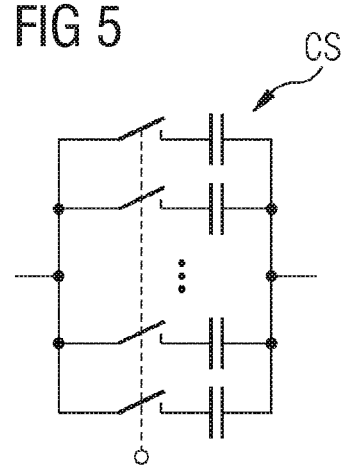
FIG. 5 is an embodiment of a switchable capacitor.

FIG. 5 shows an exemplary embodiment of a switchable capacitance CS. The capacitance CS comprises a plurality of capacitors which can be connected in parallel by closing respective switches. The switches can be set individually, for example by the control block CB.

Accordingly, both changing of a resistance of a switchable resistor network and adjusting of a switchable capacitance vary an RC time constant of a low-pass filter which results in an adjusted transfer function of the filter TP.

Figure 6:
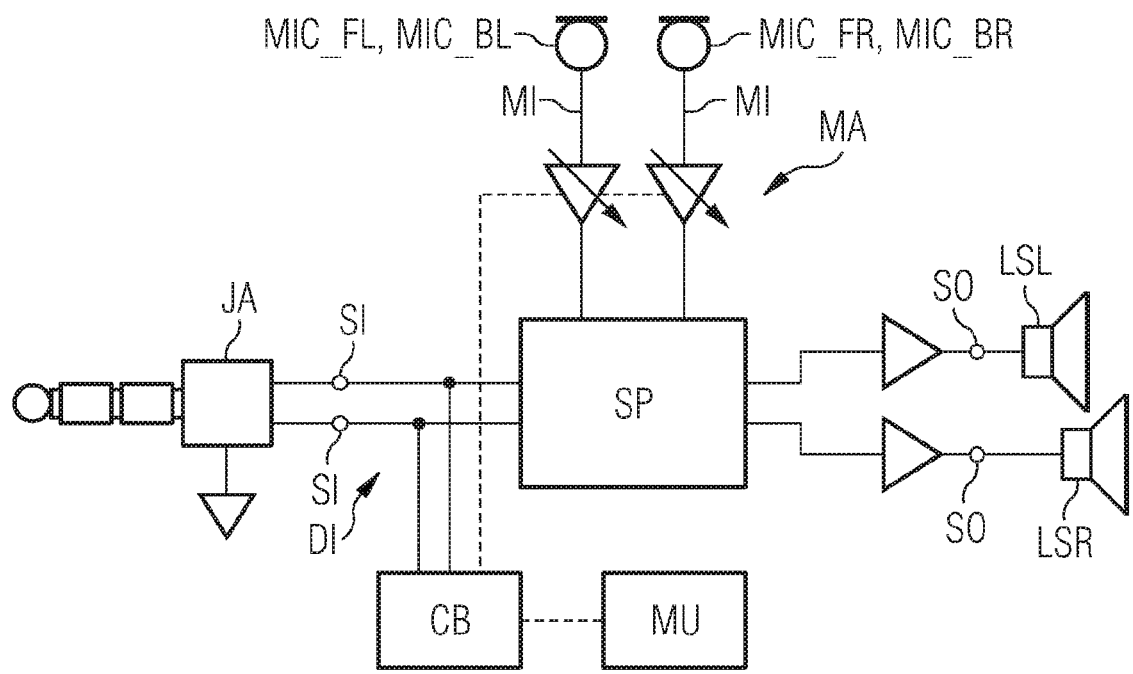
FIG. 6 is an embodiment of a fuse.

FIG. 6 shows a further embodiment of an active noise control arrangement. In this embodiment, the arrangement is configured for stereo signal processing. To this end, the signal processing block SP is coupled to respective microphones MIC_FL, MIC_FR or MIC_BL, MIC_BR respectively at the microphone input MI via a pair of amplifiers MA.

Furthermore, a pair of loudspeakers LSL, LSR is connected to the signal output SO. The signal input SI and the digital interface DI are commonly connected to a stereo audio connector JA. The control block CB, which is connected to the digital interface DI, is configured to adjust a gain of the amplifiers MA. Furthermore, the control block CB is coupled to a memory unit MU.

During operation of the active noise control arrangement, the arrangement can be operated in a calibration mode of operation and a normal mode of operation. In the calibration mode of operation, respective digital control signals are provided via the audio connector JA and the digital interface DI to the control block CB for setting and/or adjusting the gain of the amplifiers MA. The respective adjustment values for the amplifiers MA are determined adaptively in the calibration mode of operation which will be described in detail for FIG. 8. If ideal adjustment values are found within the calibration process, the respective adjustment values can be stored within the memory unit MU for further usage.

During normal mode of operation, the control block reads out the stored adjustment values from the memory unit MU and sets the amplifiers MA to a gain level corresponding to the stored adjustment values. In this mode of operation, the input signal is received via the audio connector JA and provided to the signal processing block SP. In the normal mode of operation, the control block CB neglects any signals at the common connection SI, DI with respect to an adjustment of the amplifier MA. However, in various embodiments, an initialization signal can be predetermined which can be detected by the control block CB during a normal mode of operation. In other words, during the normal mode of operation, the control block CB checks whether the initialization signal is present at the digital interface DI. If the initialization signal is detected by the control block CB, the active noise control arrangement is switched from the normal mode of operation to the calibration mode of operation, thus enabling an adjustment of the amplifiers MA via the digital interface DI. After the calibration process and storing the respective adjustment values in the memory unit MU, the active noise control arrangement is switched back to the normal mode of operation.

Furthermore, in various embodiments, when writing the adjustment values determined during the calibration process, a calibration status can be written additionally to the memory unit MU. The calibration status written to the memory unit MU indicates that a calibration has been performed such that no further calibration is necessary. In this case, the control block CB can completely ignore any digital signals at the digital interface DI corresponding to an adjustment of the gain of the amplifiers MA or a transfer function of the low-pass filters, if applicable.

The memory unit MU can comprise a PROM, an EEPROM or a flash memory module. As the respective adjustment values used for setting the gain of the amplifier MA and/or the transfer function of the low-pass filter TP can be represented by a small number of logical states, for example 8 or 16 bit per adjustment value, the memory unit can comprise simple storage elements like electrical fuses. For example, in some embodiments, the memory unit comprises seven fuses for each of the signal channels corresponding to a 7 bit information which results in 128 possible different adjustment values. A further fuse for each of the channels can be provided for storing the calibration status. In each case, a conductive state of the respective fuse corresponds to logical state to be represented.

Figure 7:
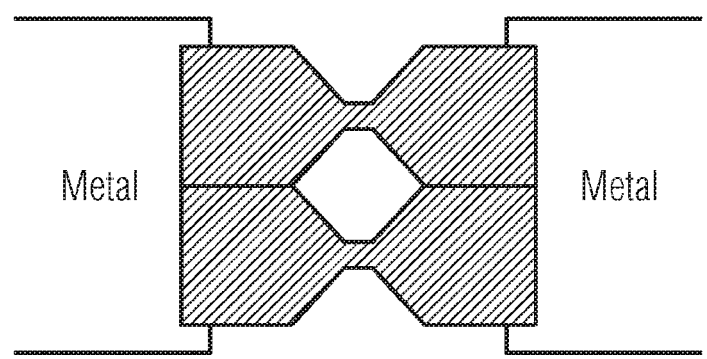
FIG. 7 is a second embodiment of an active noise control arrangement.

FIG. 7 shows an exemplary embodiment of an electrical fuse which can be used in a memory unit MU. Such a fuse can be integrated for example within an integrated circuit. For programming the fuse, a conductive state of the fuse can be influenced by providing such a current to the fuse that the narrowed portions of the fuse which are shown shaded are disconnected. However, different implementations of fuses can be used within the memory unit MU like bond wires. Programming and reading out of the fuses is not described here in further detail, as this is well known in the art.

Figure 8:
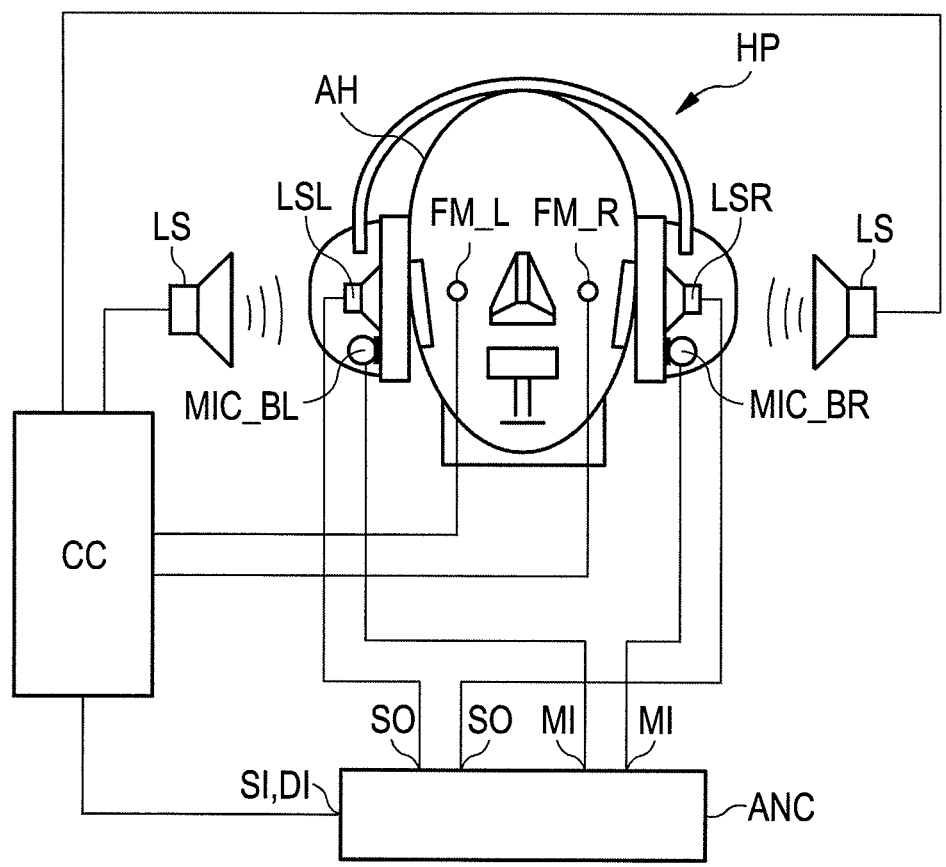
FIG. 8 is an embodiment of a calibration arrangement for an active noise control headphone.

FIG. 8 shows an exemplary calibration arrangement for calibrating an active noise control headphone. In this configuration, the headphone HP comprises loudspeakers LSL, LSR and microphones MIC_BL, MIC_BR which are connected to the signal output SO and the microphone input MI, respectively, of an active noise control arrangement ANC. The headphone HP is placed on an artificial head AH which has a set of further microphones FM_L, FM_R inside, wherein the further microphones FM_L, FM_R are arranged in or around a theoretical region of the ears of the artificial head AH. The further microphones FM_L, FM_R are connected to a calibration control CC. Furthermore, a set of loudspeakers LS is connected to the calibration control CC. The digital interface DI and the signal input SI of the active noise control arrangement ANC is connected to a respective output of the calibration control CC.

During operation of the calibration configuration, the calibration control CC provides the initialization signal to the control block CB of the active noise control arrangement ANC via the digital interface DI. Accordingly, the active noise control arrangement ANC is switched to the calibration mode of operation. An external sound signal, for example an artificial noise signal, is provided to the artificial head AH or the headphone HP, respectively, from the calibration control CC via the set of loudspeakers LS. The active noise control arrangement ANC detects the external sound signal via the microphones MIC_BL, MIC_BR and performs an active noise cancellation based on the respective microphone signals. Accordingly, respective correction signals are provided to the loudspeakers LSL, LSR for canceling out or reducing the effect of the external sound signal at the further microphones FM_L, FM_R. A residual audio level is measured with the further microphones FM_L, FM_R within the calibration control CC. Respective digital adjustment signals are sent to the active noise control arrangement ANC via the digital interface DI to adjust at least the gain of the respective amplifiers MA of the active noise control arrangement ANC. The adjustment of the gain is performed until a minimum value of the residual audio level is found by the calibration control CC. The calibration process is performed automatically, in other words without any manual interaction. Accordingly, the calibration process can be performed in less time and, due to the electronic evaluation of the residual audio level, with a higher accuracy.

If an ideal adjustment value for the amplifier gains is found, the respective values for each of the signal channels can be written to the memory unit MU of the active noise control arrangement ANC. With reference to FIG. 6, also a calibration status can be written to the memory unit MU in this case.

Further to the adjustment of the gains of the amplifiers, also a transfer function of the low-pass filters within the active noise control arrangement ANC can be adjusted during the calibration process.

FIGS. 9 and 10 show further embodiments of active noise control headphones. For implementation of the active noise control arrangement with the headphone, the arrangement can be realized in an integrated circuit.

In FIG. 9, the integrated circuit of the active noise control arrangement ANC is arranged within the ear cup of the headphone HP. The signal input SI and the digital interface DI, not shown here in detail, are connected to an audio connector JA via a cable CBL. Furthermore, the signal output SO and the microphone inputs MI are connected to the loudspeakers LSR, LSL and the microphones MIC_FR, MIC_FL. An adjustment of the gains or a calibration of the active noise control arrangement is performed via the audio connector JA and the cable CBL. Accordingly, no holes or similar openings have to be provided in the ear cup of the headphone HP for performing any adjustments.

In the embodiment of the active noise control headphone of FIG. 10, the integrated circuit with the active noise control arrangement ANC is located in a housing or dongle being arranged at the cable CBL connecting the loudspeakers LSR, LSL and the microphones MIC_FR, MIC_FL to the audio connector JA.

In both the embodiments of FIG. 9 and FIG. 10, the active noise control headphone can be fully assembled before the calibration process. Accordingly, as no further assembling has to be performed, the acoustic behavior can remain unchanged after a calibration process. Furthermore, the calibration is less sensitive to mechanical influences on the active noise control arrangement. While in a conventional active noise control arrangement with manually adjustable trimmer potentiometers, the settings can change due to a mechanical hit, for example, a digital setting of the gain as described for the embodiments above remains unchanged. In other words, the digital settings are stable compared to the manually performed settings of a conventional active noise control arrangement.

In some embodiments, the active noise control headphone may be designed for a specific mobile phone or music player or a series of mobile phones or music players. In this case, the active noise control arrangement comprised by an integrated circuit can be located within the respective mobile phone or music player, whereas the headphone HP only comprises the loudspeakers and the respective microphones.

In general, an active noise control arrangement according to the embodiments described above can be used or arranged within any sound playing device, for example also in a walkie-talkie. Furthermore, application in conjunction with vents and/or conducts is possible, for example in video projectors, computers and air conditions, in order to reduce the noise produced by respective fans. In these cases, no input signal is necessarily to be provided to the signal input of the active noise control arrangement. A microphone and a loudspeaker can be included within the respective device.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An active noise control arrangement, comprising:
a signal input for receiving an input signal;
a microphone input for receiving a microphone signal;
a signal output for providing an output signal;
a digital interface;
a signal processing block coupled to the microphone input by means of a microphone amplifier having a digitally adjustable gain, the signal processing block comprising combining means and a filter and being configured to generate the output signal at the signal output as a function of the input signal and the amplified microphone signal;
a memory unit configured to, in a calibration mode of operation, store adjustment values to set the gain of the microphone amplifier during operation;
a control block coupled to the digital interface configured to, in the calibration mode of operation, read out the stored adjustment values from the memory unit and configured to adjust the gain of the microphone amplifier corresponding to the adjustment values,
wherein the calibration mode of operation is performed automatically; and
an audio connector connected to the signal input and to the digital interface to receive digital signals for calibration and adjusting the gain of the microphone amplifier,
wherein the gain of the microphone amplifier is adjusted so that calibration occurs at a production line corresponding to the active noise control arrangement.

2. The active noise control arrangement according to claim 1, wherein the microphone amplifier comprises a digitally controllable resistor for adjusting the gain.

3. The active noise control arrangement according to claim 2, wherein the controllable resistor comprises a switchable resistor network.

4. The active noise control arrangement according to claim 1, wherein the filter has a transfer function which is digitally adjustable by the control block.

5. The active noise control arrangement according to claim 1, wherein the control block comprises the memory unit configured to store a digital adjustment value, wherein, in the calibration mode of operation, the control block is configured to write the digital adjustment value to the memory unit, and, in a normal mode of operation, the control block is configured to read the digital adjustment value from the memory unit.

6. The active noise control arrangement according to claim 5, wherein the memory unit comprises a plurality of programmable fuses for storing the digital adjustment value.

7. The active noise control arrangement according to claim 5, wherein the control block is configured to detect an initialization signal at the digital interface and to switch to the calibration mode of operation depending on a detection of the initialization signal.

8. The active noise control arrangement according to claim 7, wherein the control block is configured to write a calibration status to the memory unit and to switch to the calibration mode of operation depending on the calibration status.

9. An active noise control headphone, comprising:
an active noise control arrangement according to claim 1;
at least one loudspeaker connected to the signal output; and
at least one microphone connected to the microphone input.

10. The active noise control headphone according to claim 9, wherein the active noise control arrangement is comprised by an integrated circuit and arranged at the at least one loudspeaker or in a housing being arranged at a cable coupling the audio connector to the at least one loudspeaker.

11. A calibration method for an active noise control headphone, the headphone comprising an active noise control arrangement according to claim 1, at least one loudspeaker connected to the signal output and at least one microphone connected to the microphone input, the method comprising:
placing the headphone on an artificial head having at least one further microphone inside;
providing an external sound signal to the headphone;
performing active noise control with the active noise control arrangement;
measuring a residual audio level with the at least one further microphone;
storing adjustment values to set the gain of the microphone amplifier during operation; and
adjusting the gain of the microphone amplifier corresponding to the adjustment values via the digital interface and the control block such that the residual audio level is minimized.

12. The calibration method according to claim 11, further comprising controlling the control block via the digital interface to write a digital adjustment value corresponding to the minimized residual audio level to the memory unit.

13. The calibration method according to claim 11, wherein the control block is configured to detect an initialization signal at the digital interface and to switch to the calibration mode of operation depending on a detection of the initialization signal, the method further comprising providing the initialization signal to the control block via the digital interface.

14. The calibration method according to claim 11, wherein the filter has a transfer function which is digitally adjustable by the control block, the method further comprising adjusting the transfer function of the filter via the digital interface and the control block such that the residual audio level is minimized.

15. The active noise control arrangement according to claim 1, wherein, in the calibration mode of operation, the respective digital signals are provided via the audio connector and the digital interface to the control block for adjusting the gain of the microphone amplifier.

16. An active noise control arrangement, comprising:
a signal input for receiving an input signal;
a microphone input for receiving a microphone signal;
a signal output for providing an output signal;
a digital interface configured to receive adjustment values via a calibration circuit;
a signal processing block coupled to the microphone input by means of microphone amplifier having a digitally adjustable gain, the signal processing block comprising combining means and a filter and being configured to generate the output signal at the signal output as a function of the input signal and the amplified microphone signal;
a memory unit configured to, in a calibration mode of operation, store the adjustment values to set the gain of the microphone amplifier during operation; and
a control block coupled to the digital interface, the control block configured to, in a normal mode of operation, read out the stored adjustment values from the memory unit and configured to adjust the gain of the microphone amplifier corresponding to the adjustment values;
an audio connector connected to the signal input and to the digital interface to receive digital signals for calibration and adjusting the gain of the microphone amplifier,
wherein the gain level is provided by the calibration circuit evaluating residual noise in the active noise control arrangement.

17. The active noise control arrangement according to claim 16, wherein the control block is configured to disregard any signals at the digital interface during the normal mode of operation.

18. An active noise control arrangement, comprising:
a signal input for receiving an input signal;
a microphone input for receiving a microphone signal;
a signal output for providing an output signal;
a digital interface;
a signal processing block coupled to the microphone input by means of a microphone amplifier having a digitally adjustable gain, the signal processing block comprising combining means and a filter and being configured to generate the output signal at the signal output as a function of the input signal and the amplified microphone signal;
a memory unit configured to, in a calibration mode of operation, store adjustment values to set the gain of the microphone amplifier during operation;
a control block coupled to the digital interface configured to read out the stored adjustment values from the memory unit and configured to adjust the gain of the microphone amplifier corresponding to the adjustment values; and
an audio connector connected to the signal input and to the digital interface to receive digital signals for calibration and adjusting the gain of the microphone amplifier, wherein the gain of the microphone amplifier is adjusted so that calibration occurs at a production line corresponding to the active noise control arrangement.

19. An active noise control arrangement, comprising:
a signal input for receiving an input signal;
a microphone input for receiving a microphone signal;
a signal output for providing an output signal;
a digital interface;
a signal processing block coupled to the microphone input by means of a microphone amplifier having a digitally adjustable gain, the signal processing block comprising combining means and a filter and being configured to generate the output signal at the signal output as a function of the input signal and the amplified microphone signal;
a memory unit configured to, in a calibration mode of operation, store adjustment values to set the gain of the microphone amplifier during operation;
a control block coupled to the digital interface configured to read out the stored adjustment values from the memory unit and configured to adjust the gain of the microphone amplifier corresponding to the adjustment values; and
an audio connector connected to the signal input and to the digital interface to receive digital signals for calibration and adjusting the gain of the microphone amplifier,
wherein the filter has a transfer function which is digitally adjustable by the control block, such that the gain of the microphone amplifier is adjustable by the control block and the filter,
wherein the gain of the microphone amplifier is adjusted so that calibration occurs at a production line corresponding to the active noise control arrangement.

20. The active noise control arrangement according to claim 19, wherein a corner frequency of the filter is set to an optimized value, and wherein a resistance or a capacitance of the filter is digitally set to obtain the transfer function.

21. An active noise control arrangement, comprising:
a signal input for receiving an input signal;
a microphone input for receiving a microphone signal;
a signal output for providing an output signal;
a digital interface;
a signal processing block coupled to the microphone input by means of a microphone amplifier having a digitally adjustable gain, the signal processing block comprising combining means and a filter and being configured to generate the output signal at the signal output as a function of the input signal and the amplified microphone signal;
a memory unit configured to, in a calibration mode of operation, store adjustment values to set the gain of the microphone amplifier during operation;
a control block coupled to the digital interface configured to read out the stored adjustment values from the memory unit and configured to adjust the gain of the microphone amplifier corresponding to the adjustment values; and
an audio connector connected to the signal input and to the digital interface to receive digital signals for calibration and adjusting the gain of the microphone amplifier,
wherein the control block is configured to write a calibration status to a memory unit of the control block, and to switch to the calibration mode of operation depending on the calibration status,
wherein the gain of the microphone amplifier is adjusted so that calibration occurs at a production line corresponding to the active noise control arrangement.

22. The active noise control arrangement according to claim 21, wherein when the calibration status written to the memory unit indicates that calibration has been performed and that no further calibration is necessary, the control block is configured to ignore any digital signals at the digital interface corresponding to adjusting the gain of the amplifiers or a transfer function of the filter.

* * * * *